(12) United States Patent
Duqi et al.

(10) Patent No.: US 11,810,732 B2
(45) Date of Patent: Nov. 7, 2023

(54) WATERPROOF MEMS BUTTON DEVICE, PACKAGE HOUSING THE BUTTON DEVICE, AND METHOD OF MANUFACTURING THE BUTTON DEVICE

(71) Applicant: STMICROELECTRONICS S.r.l., Agrate Brianza (IT)

(72) Inventors: Enri Duqi, Milan (IT); Gabriele Gattere, Castronno (IT); Carlo Valzasina, Gessate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/690,869

(22) Filed: Mar. 9, 2022

(65) Prior Publication Data
US 2022/0301789 A1     Sep. 22, 2022

(30) Foreign Application Priority Data

Mar. 16, 2021   (IT) .......................... 102021000006257

(51) Int. Cl.
| | |
|---|---|
| *H01H 13/14* | (2006.01) |
| *B81B 3/00* | (2006.01) |
| *G01L 1/16* | (2006.01) |
| *H01H 13/06* | (2006.01) |
| *H10N 30/30* | (2023.01) |

(52) U.S. Cl.
CPC .......... *H01H 13/14* (2013.01); *B81B 3/0021* (2013.01); *G01L 1/162* (2013.01); *H01H 13/06* (2013.01); *H10N 30/302* (2023.02); *B81B 2201/018* (2013.01)

(58) Field of Classification Search
CPC ...... H01H 13/14; H01H 13/06; B81B 3/0021; B81B 2201/018; B81B 3/00; G01L 1/162; G01L 1/16; H10N 30/302; H03K 17/965; H01N 30/30
See application file for complete search history.

(56) References Cited

U.S. PATENT DOCUMENTS

| | | | |
|---|---|---|---|
| 10,623,866 B2 * | 4/2020 | Cerini | .................... H04R 17/02 |
| 10,683,200 B2 | 6/2020 | Paci et al. | |
| 11,051,113 B2 * | 6/2021 | Cerini | ................. B81C 1/00158 |
| 2014/0174183 A1 | 6/2014 | Comi et al. | |

(Continued)

FOREIGN PATENT DOCUMENTS

| | | |
|---|---|---|
| DE | 102007027652 A1 | 12/2008 |
| EP | 3147258 A1 | 3/2017 |

(Continued)

*Primary Examiner* — Lheiren Mae A Caroc
(74) *Attorney, Agent, or Firm* — SEED IP LAW GROUP LLP

(57) ABSTRACT

A button device includes a fixed support structure; a movable structure, laterally surrounded by the support structure and configured to deform at least in part under the action of an external force; and a fluid-tight protection cap. The movable structure includes a piston element, deformable elements having piezoelectric transducers arranged thereon, and anchor elements that couple the piston element to the deformable elements. When an external force acts on the piston element, the anchor elements transfer this force to the deformable elements and to the piezoelectric transducers, so as to sense the extent of this force.

20 Claims, 7 Drawing Sheets

(56) References Cited

U.S. PATENT DOCUMENTS

| | | |
|---|---|---|
| 2014/0285871 A1 | 9/2014 | Moidu |
| 2015/0092345 A1 | 4/2015 | Ely |
| 2016/0225551 A1 | 8/2016 | Shedletsky |
| 2017/0108986 A1 | 4/2017 | Lai et al. |
| 2018/0052011 A1 | 2/2018 | Oshima et al. |
| 2018/0339898 A1 | 11/2018 | Gattere et al. |
| 2020/0095114 A1* | 3/2020 | Pomarico .................. G01L 3/00 |
| 2023/0050748 A1* | 2/2023 | Silvestre .............. B81B 3/0021 |

FOREIGN PATENT DOCUMENTS

| | | |
|---|---|---|
| EP | 3407492 A1 | 11/2018 |
| EP | 3441358 A1 | 2/2019 |

* cited by examiner

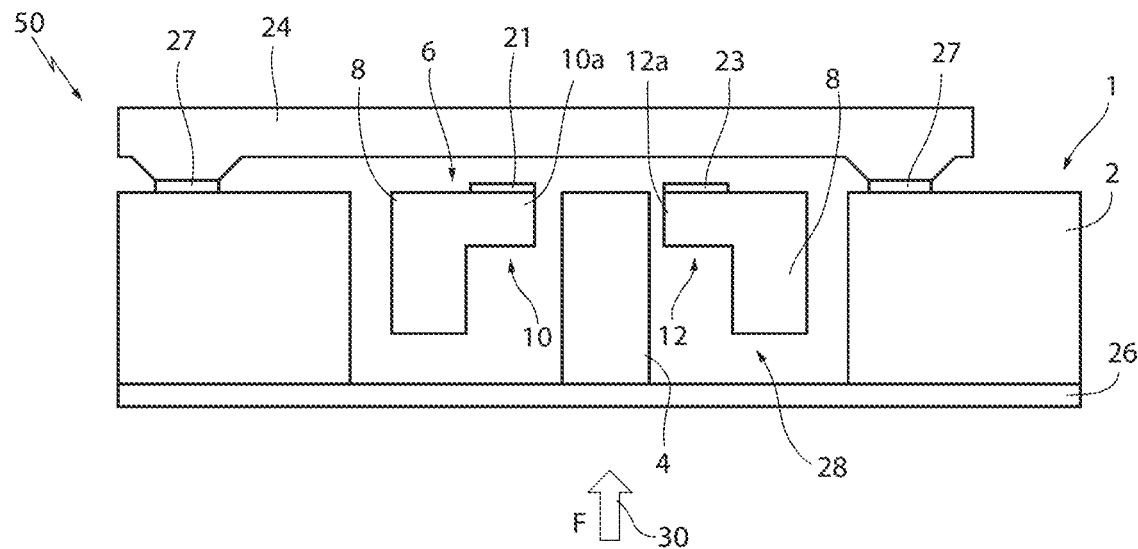
FIG. 1
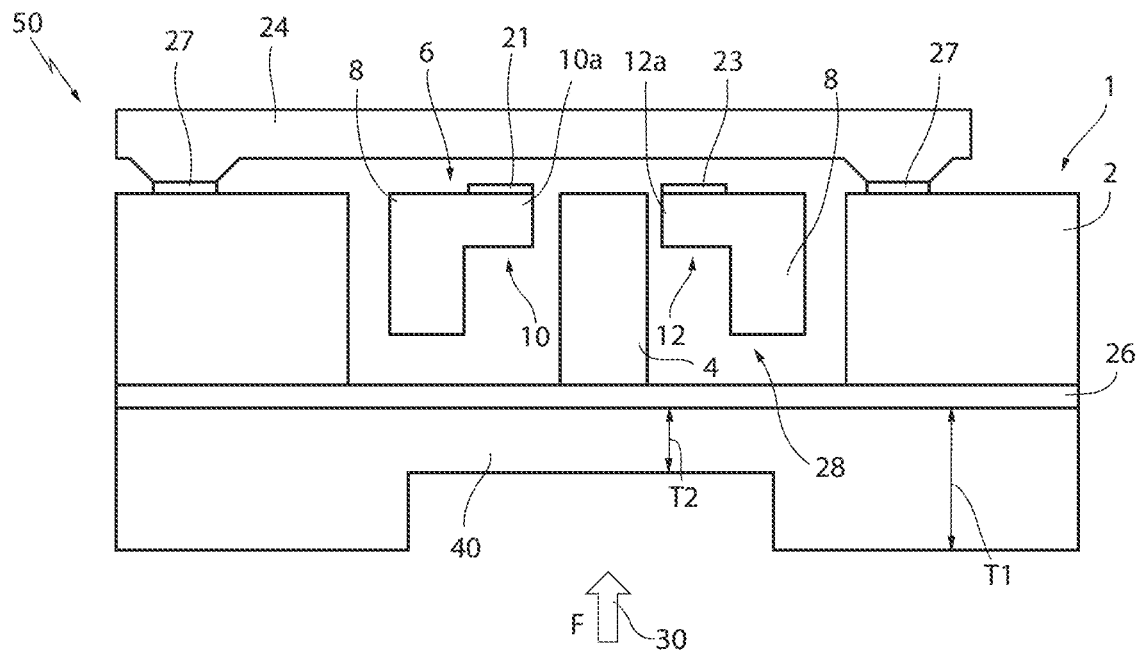
FIG. 3
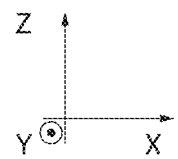

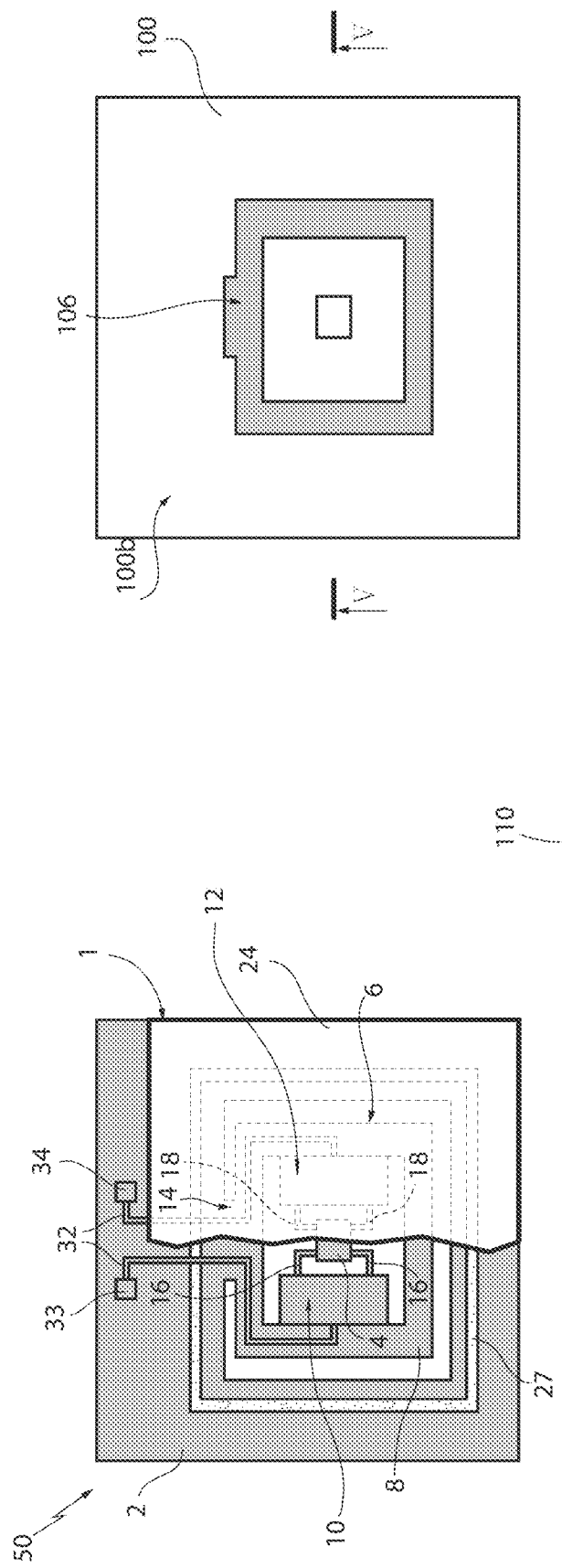
FIG. 2
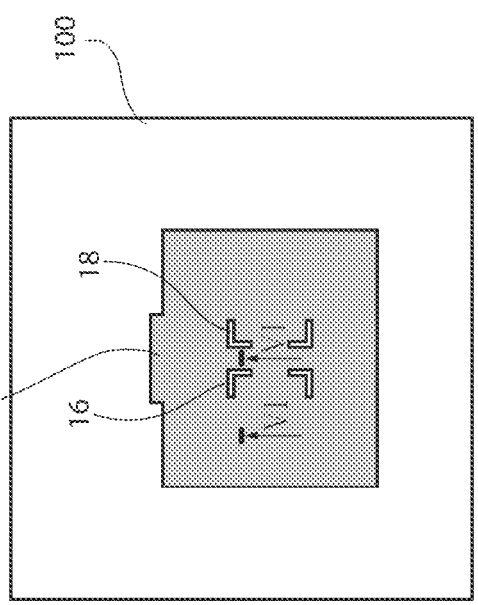
FIG. 5B
FIG. 6B
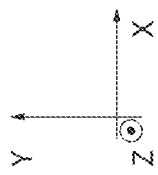

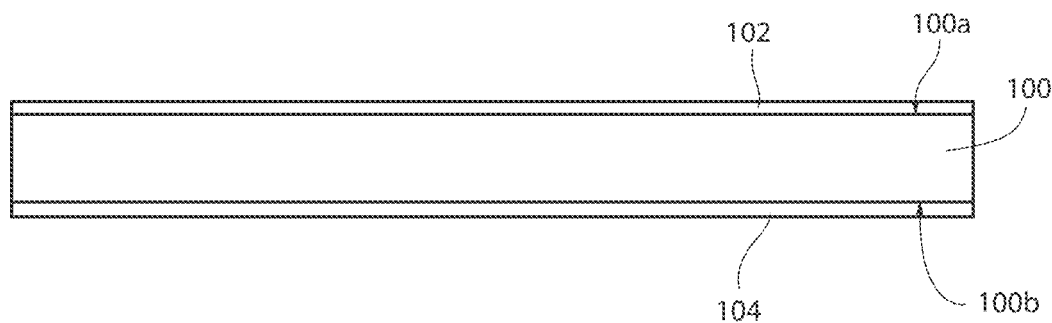
FIG. 4
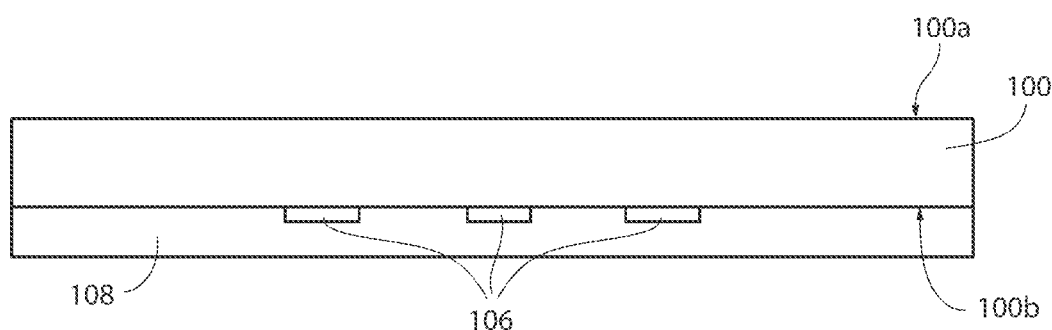
FIG. 5A
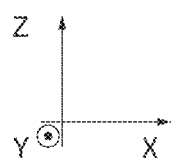

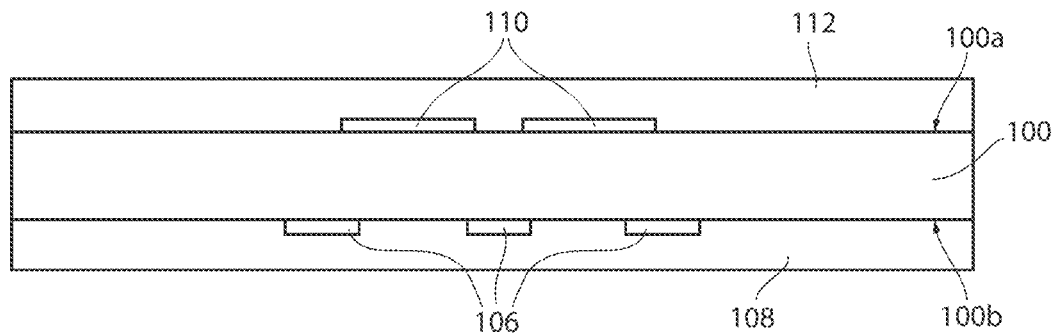
FIG. 6A
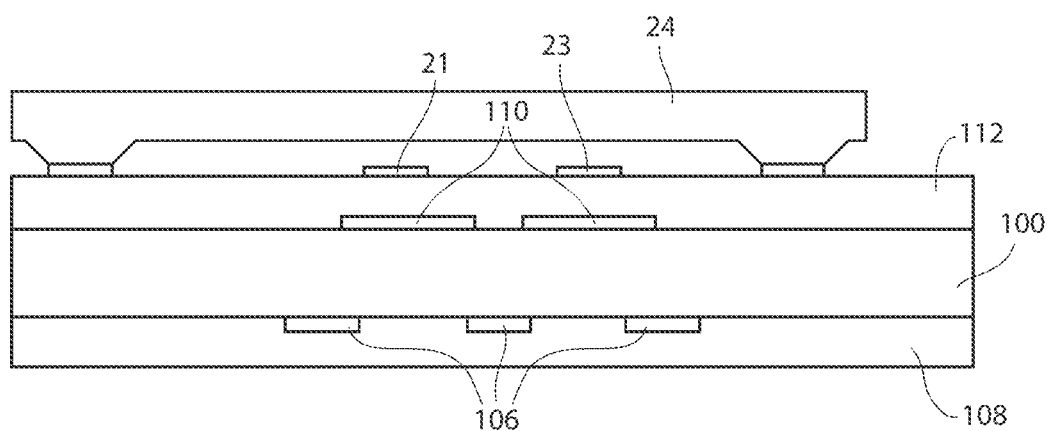
FIG. 8
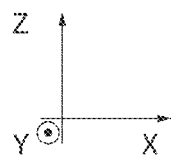

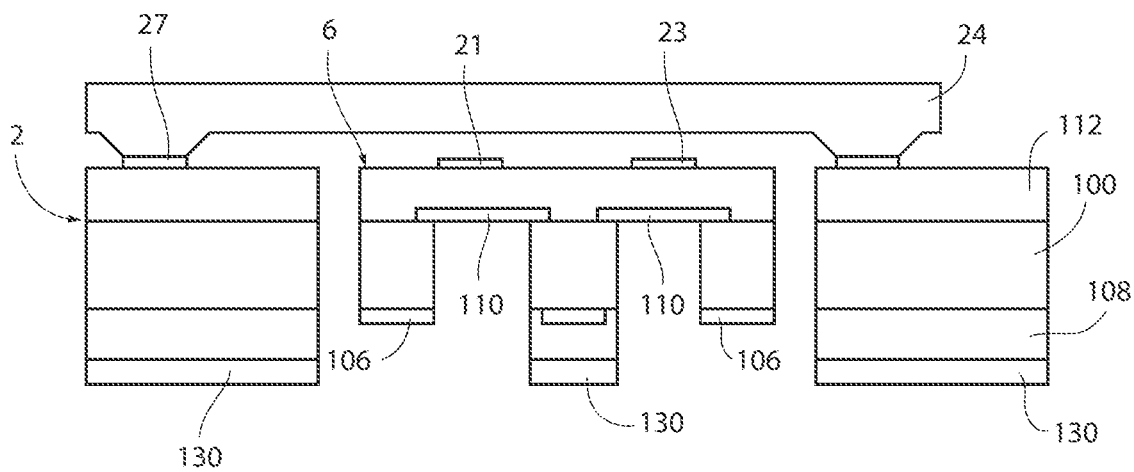
FIG. 9
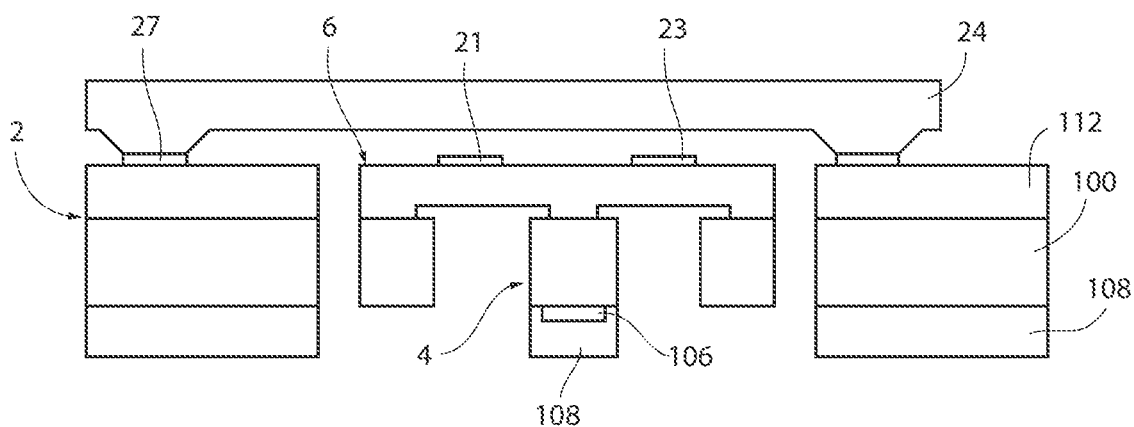
FIG. 10
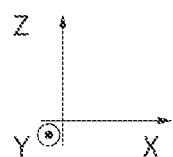

WATERPROOF MEMS BUTTON DEVICE, PACKAGE HOUSING THE BUTTON DEVICE, AND METHOD OF MANUFACTURING THE BUTTON DEVICE

BACKGROUND

Technical Field

The present disclosure relates to a button device, a housing, or package, housing the button device and a method of manufacturing the button device. In particular, the button device is made using MEMS (Micro-Electro-Mechanical Systems) technology and is waterproof. Specifically, hereinafter reference is made to a button, operable by a user to generate an electrical signal used by an electronic apparatus for the operation thereof.

Description of the Related Art

As is known, input devices, such as keys, buttons or switches for portable electronic apparatuses, such as smartphones and smartwatches, are typically physical tactile elements that allow the user to provide signals to the portable electronic apparatus. For example, pressing a button on a smartphone allows a user to wake up the smartphones screen when in stand-by.

Input devices of known type comprise strain sensors, which exploit different physical principles to sense the command given by the user; for example, strain sensors of known type are piezoresistive sensors, which sense a user command through a resistance variation caused by the application of an external force (for example, the pressing of the button) on the input device itself.

Nowadays, it is increasingly desired that input devices be impermeable to fluids, typically water, to prevent the portable electronic apparatus from damage due to infiltration of fluid or to allow the apparatus to be used in water, for example while practicing or participating in water sports.

To this end, nowadays impermeable input devices are provided with sealing elements, such as O-rings, integrated into the assembly of portable electronic apparatuses, which allow to prevent water from entering inside the portable electronic apparatus.

An example of an input device comprising an O-ring is described in the United States Patent Publication US 2015/0092345.

A further example of input device of known type is described in the United States Patent Publication US 2016/0225551, which describes a portable electronic apparatus comprising a physical button as an input device. Here, the button comprises a cap, movable in an enclosure of the portable electronic apparatus, a flexible element, coupled to the cap, and a strain sensor, coupled to the flexible element In use, an external force (for example, due to the pressure of the user's finger on the cap) deflects the flexible element, generating a corresponding stress in the strain sensor, which generates an electrical signal and supplies the electrical signal to a processing element However, this solution does not ensure complete impermeabilization of the key and is also not completely satisfactory.

In fact, in the input devices for portable apparatuses it is desired that they have a predefined stroke and a long-lasting tightness, as well as reduced dimensions.

However, the increasing trend to miniaturization of portable electronic apparatuses is often incompatible with the current waterproof assemblies of the input devices; for example, current O-rings have non-negligible dimensions, which may interfere with the miniaturization requirement In order to reconcile tightness and reduced dimensions, the current known input devices for portable electronic apparatuses are complex both to manufacture and to assemble.

In addition, the current sealing elements are subject to wear, for example due to repeated stresses of the input device, as well as aging, with a reduction in the tightening capabilities of the sealing elements.

Furthermore, the input devices of known type usually have high power consumption, which may significantly reduce the battery life of the portable electronic apparatus.

BRIEF SUMMARY

According to the present disclosure, a button device, a package housing the button device and a method of manufacturing the button device are described in the present disclosure as follows herein.

In at least one embodiment of the present disclosure, a microelectromechanical button structure may include a support with a surface; a support structure coupled to the surface of the support; a cap coupled to the support structure by a fluid tight seal; a cavity delimited by the support, the support structure, and the cap, the cavity extends through the support structure to the surface of the support; and a piston element coupled to the surface of the support and within the cavity; a movable structure within the cavity, the movable structure.

The movable structure may include: a ring portion is coupled to the support structure, the ring portion extends around the piston element, and the ring portion has a first thickness; a first deformable portion extends from the ring portion towards the piston element, the first deformable portion is coupled to the piston element, and the first deformable portion has a second thickness less than the first thickness; and a second deformable portion extends from the ring portion towards the piston element and is coupled to the piston element, the second deformable portion is spaced apart from the first deformable element by the piston element, and the second deformable portion has the second thickness.

The microelectromechanical button structure may further includes a first sensing element on the first deformable portion and configured to, in operation, detect a deformation of the first deformable element; and a second sensing element on the second deformable portion and configured to, in operation, detect a deformation of the second deformable element.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIG. 1 shows, in cross-section, a MEMS button structure, according to an embodiment of the present disclosure;

FIG. 2 shows, in top-plan view, the MEMS button structure of FIG. 1;

FIG. 3 shows, in cross-section, the MEMS button structure of FIG. 1, coupled to a body of an outer device, according to an embodiment of the present disclosure;

FIGS. 4-10 show steps of a process for manufacturing the MEMS structure of FIGS. 1 and 2;

DETAILED DESCRIPTION

Figure 7A:
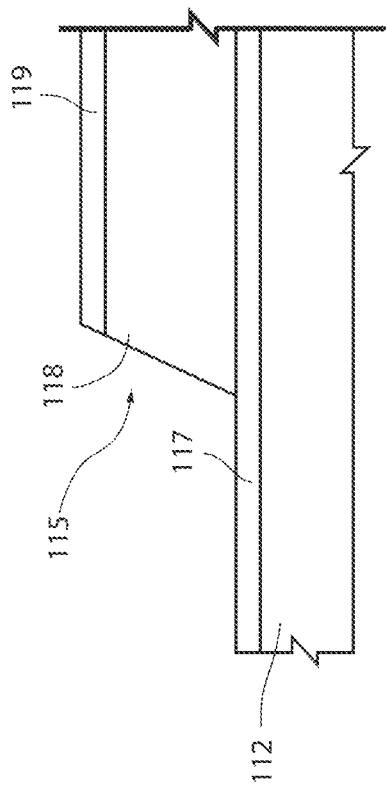
Figure 7B:
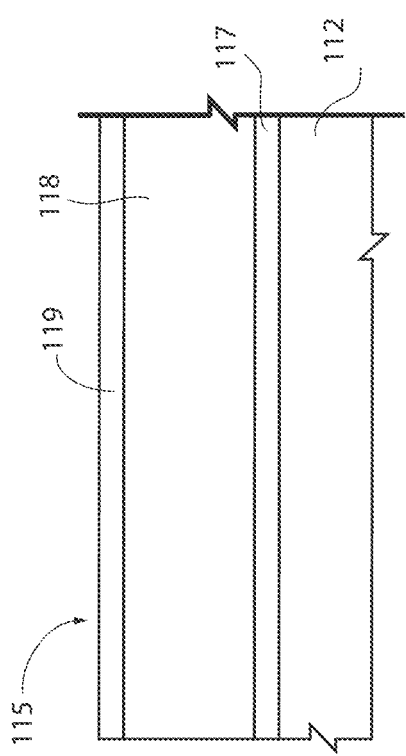

FIG. 1 shows, in a lateral cross-section view in a Cartesian coordinate system of axes X, Y, Z, an embodiment of a MEMS structure 50 for being used as a button. FIG. 2 shows, in a top view on the XY-plane, the MEMS structure 50.

With reference to both FIGS. 1 and 2, the MEMS structure 50 comprises: a fixed structure 1, including a support frame 2, here by way of example of closed quadrangular shape; and a movable structure 6 arranged inside (that is, completely surrounded by) the support frame 2. The movable structure 6 is partly mechanically coupled to the support frame 2 by at least one support region 14 having the shape of a beam or cantilever, which protrudes from a portion of the movable structure 6. The at least one support region 14 may be referred to as a protrusion or extension.

The support frame 2 has a thickness, measured along the Z-axis, in the range 50-500 µm.

The movable structure 6 includes: a pillar (or piston) 4, free to move, under the action of a force acting thereon, along the Z-axis (to this end, the pillar 4 is not directly constrained to the support frame 2); a ring 8, of an exemplary quadrangular shape, arranged inside the support frame 1 and surrounding in turn the pillar 4 (the ring 8 includes the support region 14); and a first and a second sensing region 10, 12 structurally connected to the ring 8 (in particular, which extend in structural continuity of the ring 8) and also coupled to the pillar 4. The ring 8 may be referred to as a suspended structure.

As will become apparent from the present disclosure, the element (referred to as "ring") indicated with the reference number 8 may have a shape which is open and, in general, different from that of a ring. For example, the element 8 may have an open shape on one side (e.g., without the side opposite to the open shape coupled to the support frame 2); or it may be without a side, for example "U"-shaped. Hereinafter, however, reference will be made to a "ring" 8 without thereby losing generality.

Each first and second sensing region 10, 12 is mechanically coupled to the pillar 4 by respective anchors 16, 18, herein in particular made as a respective pair of support arms 16 and 18. The support arms 16 extend from pillar 4 towards the first sensing region 10. Similarly, the support arms 18 extend from pillar 4 towards the second sensing region 12.

The dimensions of the support arms 16, 18 are chosen, as better illustrated hereinafter, in such a way that they have a stiffness (intended as the ability to oppose to deformation when a force is applied along the direction of the Z-axis) being smaller than the stiffness of the ring 8 and the support region 14. In particular, the support arms 16, 18 have a thickness, along the Z-axis, being smaller than the thickness of the support region 14 along the Z-axis. According to an embodiment, the thickness of each support arm 16, 18 is in the range 5-50 µm, while the thickness of the ring 8 and the support region 14 is in the range 50-500 µm.

The first and the second sensing regions 10, 12 extend inside the ring 8, and protrude towards the pillar 4 at opposite sides of the pillar 4. In other words, the first and the second sensing regions 10, 12 are arranged between a respective side of the ring 8 and the pillar 4.

The first sensing region 10 includes a structural portion 10a having a first sensing element 21 extending thereon, herein in particular a piezoelectric stack which is part of a piezoelectric transducer. The second sensing region 12 includes a respective structural portion 12a having a second sensing element 23 extending thereon, herein in particular a piezoelectric stack which is part of a piezoelectric transducer. The structural portions 10a, 12a may be less thick than the ring 8. For example, in the embodiment as shown in FIGS. 1 and 3, the structural portions 10a, 12a are less thick than the ring 8.

As visible from the section of FIG. 1, the ring 8 has a thickness, along the Z-axis, being greater than the thickness of the first and the second sensing regions 10, 12, in such a way that the ring 8 is stiffer to deformation than the first and the second sensing regions 10, 12. In particular, the first and the second sensing regions 10, 12 have the same thickness (along the Z-axis) as the support arms 16, 18.

The support frame 2 and the pillar 4 are coupled (e.g., glued by a glue or an adhesive) at the bottom to a bottom support 26, such as a double-sided adhesive tape, for allowing a handling of the MEMS structure 50 and to form an interface for a further coupling towards a package or other substrate or body. In particular, the bottom support 26 is a tape for gluing dice or is a tape including a DAF (Die Attach Film) for coupling structural features such as two dice together. As an alternative to the double-sided adhesive tape 26, a substrate of semiconductor material may be used such as silicon, or plastic, or metal material such as steel, or yet another support having shape and material chosen as needed. In this case, the coupling between the support frame 2/pillar 4 and such a substrate may take place by glue, adhesive, adhesive tape, or some other similar or like type of bonding technique. The bottom support 26 is optional since a corresponding support might be provided and present at a body having the MEMS structure 50 coupled thereto.

A protective cap 24 extends above the support frame 2, and is physically coupled to the support frame 2 along an annular region 27 which completely surrounds the movable structure 6, so as to delimit an inner cavity 28; the annular region 27 is for example formed using glass frit, or other technique for ensuring a fluidic insulation of the inner cavity 28 with respect to an environment external thereto (that is, ensuring that water or other fluid does not reach or enter the inner cavity 28). The protective cap 24 extends at a distance, along the Z-axis, from the movable structure 6 and from the pillar 4. This distance is for example in the range 1-50 µm.

In use, a pressure force F is exerted at the bottom support 26, along the Z-axis (as indicated by arrow 30 in FIG. 1). This force F causes a deflection of the bottom support 26 which, as a result, pushes the pillar 4 upwards (that is, along the Z-axis, approaching the protective cap 24). When the force F is released, the pillar 4 returns to the starting position. The pillar 4, therefore, operates similarly to a piston moving along the Z-axis of the Cartesian coordinate system. By moving towards the cap 24, the pillar 4 causes a corresponding deflection of the support arms 16 and 18 coupled thereto, which, as a result, generates a corresponding deflection of the first and the second sensing regions 10, 12. However, since the first and the second sensing regions 10, 12 are constrained to the ring 8 at their side opposite to that having the arms 16, 18 coupled thereto, the arms 16, 18 are subject to a traction strain of axial type. The axial deformation of the first and the second sensing regions 10, 12 along the X-axis is a consequence of the displacement of pillar 4.

Given the greater stiffness of the ring 8 and the support region 14 with respect to that of the support arms 16, 18 and the sensing regions 10, 12, the deformation to which the support arms 16, 18 and the sensing regions 10, 12 are subject, is greater than that to which the ring 8 is subject (which, for the purposes of the present disclosure, may be defined as negligible relative to the deflection of the support arms 16, 18 and the sensing regions 10, 12).

The deformation, or tensile stress, to which the sensing regions 10, 12, and in particular the piezoelectric elements 21, 23 are subject, is a function of (in particular, proportional to) the force F applied. The extent of the force F may therefore be sensed on the basis of the resulting deformation of the piezoelectric elements 21, 23 and corresponding variation of the electrical signal generated by the same in response to this deformation, according to the known piezoelectric principle. FIG. 2 shows, in an exemplary embodiment, conductive tracks 31, 32 which connect each piezoelectric element 21, 23 to respective pads 33, 34, contactable to acquire the generated electrical signal, in use by the piezoelectric elements 21, 23, in a per se known manner.

The MEMS structure 50 is configured to be coupled, utilizing the bottom support 26, to an enclosure of a device which comprises, or integrates, and uses the MEMS structure 50. For example, FIG. 3 illustrates the MEMS structure 50 of FIG. 1 coupled to a body 40, which may be a portion of a case of a smartwatch, a case of a smartphone, or some other similar or like type of casing, housing, or packaging of an electronic device. The force F is, in this situation, applied onto the body 40, which, by deflection, transfers the force F to the bottom support 26, and, therefore, to the pillar 4. In some embodiments, the body 40 may be include a conductive material such as aluminum. As shown in FIG. 3, the body 40 includes a first portion of a first thickness T1 that overlaps with the support frame 2 of the MEMS structure 50 and a second portion of a second thickness T2 that overlaps the pillar 4. The first thickness being greater than the second thickness. The force F is applied where the thickness of the body 40 is smaller or thinner to concentrate the deflection at the pillar 4 that overlaps the second portion of the second thickness T2. For example, the first thickness T1 may be equal to or greater than 500 μm and the second thickness T2 may be equal to 100 μm at the pillar 4.

In some embodiments, the first portion of the first thickness T1 may surround the second portion of the second thickness T2. In some embodiments, the first portion of the firs thickness T1 may be one of a plurality of first portions of the first thickness T1 that are adjacent to the second portion of the second thickness T2.

It is apparent that, by suitably modulating or varying the thickness and the stiffness of the body 40, the sensitivity of the MEMS structure 50 may be modulated or varied accordingly.

In general, the present disclosure finds use in application contexts wherein the forces to be sensed are in the range 0.5-50 N (Newtons). However, embodiments of the present disclosure may be adapted or adjusted to sense forces less than 0.5N or greater than 50N depending on the situation in which the embodiments of the present disclosure are to be utilized.

A process of manufacturing the MEMS structure 50 of FIGS. 1 and 2 is now described, with reference to FIGS. 4-10 of the present disclosure.

With reference to FIG. 4, a wafer is arranged including a silicon substrate 100, having a front side 100*a* and a back side 100*b*, opposite to each other along the Z-axis. The substrate 100 has a thickness, along the Z-axis, in the range 300-800 μm. A front oxide layer 102 and a back oxide layer 104 are formed by thermal oxidation steps, respectively on the front side 100*a* and on the back side 100*b*. The thermal oxidation step may be replaced by an oxide deposition step, exclusively at the back side 100*b*. It is readily apparent that the use of silicon for the substrate 100 and silicon oxide for layers 102 and 104 is exemplary of an embodiment, other materials typically used in the semiconductor industry may be used. As will be apparent from the following description, the back oxide layer 104 functions as an etching mask to protect selective portions of the substrate 100; in general, therefore, the material chosen for the layer 104 is such that the substrate 100 may be selectively etched and removed with respect to the layer 104.

Then, FIG. 5A, the back oxide layer 104 is shaped to form a mask 106. The front oxide layer is completely removed. As may be observed in FIG. 5B, the mask 106 has a shape and extension equal to the shape and extension designed for the ring 8, the support region 14, and the pillar 4. FIG. 5A is a view along section line V-V of FIG. 5B.

A step of growing an epitaxial layer 108 is then carried out at the back side 100*b* of the substrate 100, burying the mask 106. The epitaxial layer 108 has a thickness, along the Z-axis, in the range 5-50 μm, for example equal to approximately 10 μm. The epitaxial layer 108 is then subject to a planarization process, for example by CMP (Chemical Mechanical Polishing) technique, in order to planarize (e.g., level) and/or smooth the surface of the same. It is apparent that the layer 108 may be formed according to a technique other than epitaxy and therefore the term "epitaxial layer" is used herein merely as an example of a possible embodiment.

With reference to FIG. 6A (which is a view along section line VI-VI of FIG. 6B), the front of the wafer is processed. To this end, a mask 110, for example of silicon oxide (or, in general, of a material which may be selectively removed with respect to the material of the substrate 100), is formed on the front side 100*a* of the substrate 100. Before forming the mask 110, the substrate 100 may optionally be processed to reduce the thickness thereof, for example to reach a final thickness, along the Z-axis, in the range 50-500 μm (that is, substantially like the support frame 2), for example equal to approximately 500 μm. FIG. 6B illustrates, in XY-plane view, the mask 110. The mask 110 has a perimeter, on the XY-plane, corresponding to the perimeter of the mask 106, and protects both the area wherein the ring 6 will be formed and the area internally delimited by the ring 6, except for the regions wherein the support arms 16 and 18 will be formed (these regions are left exposed, as is observed from FIG. 6B). The support arms 16 and 18 may be referred to as anchors.

A step of forming an epitaxial layer 112 on the front side 100*a* is carried out, burying the mask 110. The epitaxial layer 112 has a thickness, along Z, in the range 5-50 μm, for example equal to 7.5 μm. It is apparent that the layer 112 may be formed according to a technique other than epitaxy and therefore the term "epitaxial layer" is used herein merely as an example of a possible embodiment.

The sensing elements 21 and 23 are then formed. As said, the sensing elements 21 and 23 are in particular piezoelectric elements, each including a stack formed by a piezoelectric layer (for example aluminum nitride, AlN) interposed between a bottom electrode and a top electrode, in a per se known manner. With reference to FIGS. 7A-7D, there are illustrated steps for manufacturing a piezoelectric stack 115 on the epitaxial layer 112, illustrated limitedly to the portion of the wafer involved.

Figure 7C:
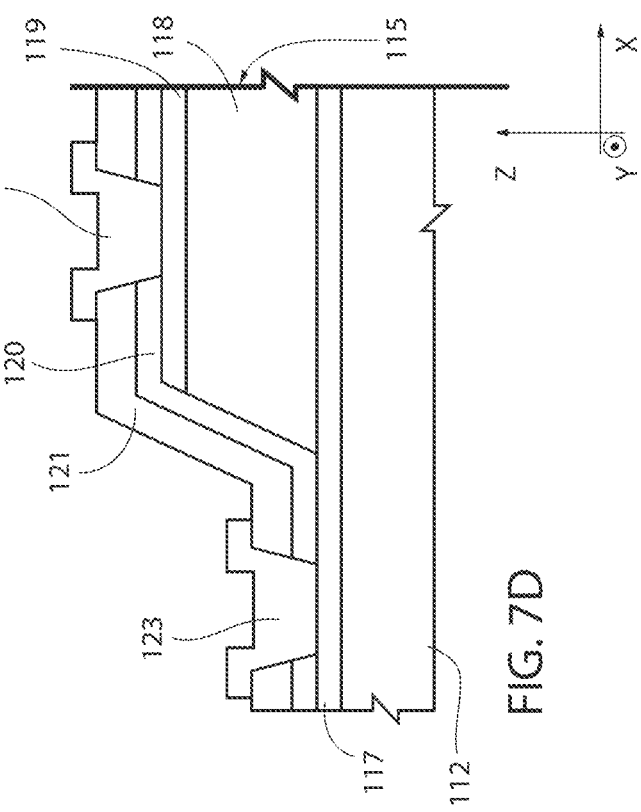
Figure 7D:
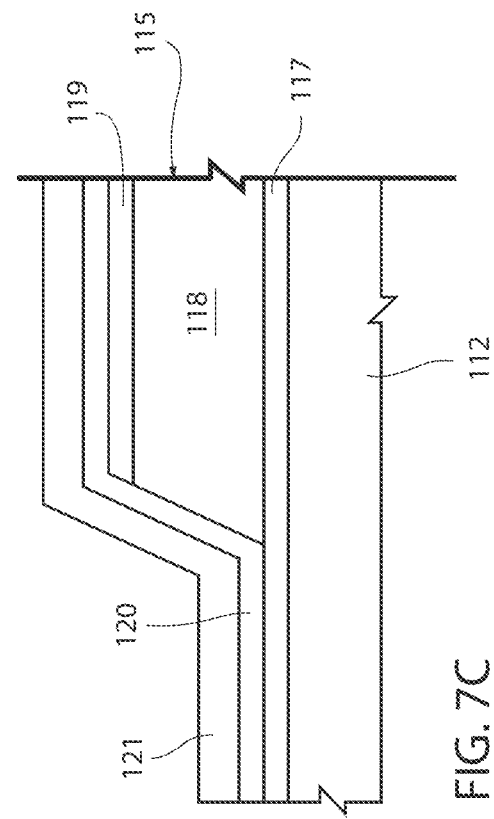

The steps of manufacturing the piezoelectric stack 115 thus include a step of forming the bottom electrode 117, for example by depositing a layer of molybdenum with a thickness of approximately 200 nm; a step of forming the piezoelectric layer 118, for example by depositing AlN on the bottom electrode layer with a thickness equal to approximately 1 μm; and a step of forming the top electrode 119, for example by depositing a layer of molybdenum with a thickness of approximately 200 nm on the piezoelectric layer. The stack 115 thus formed is then shaped, FIG. 7B, to define the desired shape of the sensing elements 21, 23, in particular according to what has already been described with reference to FIGS. 1 and 2. In FIG. 7C, the shaped piezoelectric stack is then protected through a passivation layer 120. Furthermore, a hard mask layer 121 (e.g., TEOS) is formed on the wafer, above the epitaxial layer 112 and the sensing elements 21, 23.

Electrical contacts 122, 123 are also formed, through the passivation layer 120 and the hard mask layer 121, for electrically contacting the top and bottom electrodes 119, 117, respectively. The conductive tracks 31, 32 are also formed on the hard mask layer 121, for example simultaneously with the formation of the electrical contacts 122, 123, electrically coupled to the electrical contacts 122, 123.

With reference to FIG. 8, the protective cap 24 is arranged above the epitaxial layer 112. The protective cap 24 may be manufactured by shaping a further semiconductor wafer, and carrying out a wafer-to-wafer bonding step, so as to couple the protective cap 24 on the hard mask layer 121 (by forming the annular region 27 described with reference to FIG. 1).

Then, FIG. 9, a lithography and etching step is carried out to remove selective portions of the epitaxial layers 108, 112 and of the substrate 100 not protected by the masks 106 and 110. In particular, a photoresist mask 130 is formed on the epitaxial layer 108, so as to protect the regions intended to form the support frame 2 and leave the regions intended to form the movable structure 6 (except for the region intended to form the pillar 4, which is also protected by the mask 130) exposed to etching.

An etching is then carried out from the back of the wafer to remove the material (here, silicon) exposed through the photoresist mask 130. The etching is herein of anisotropic type, and proceeds by removing selective portions of the epitaxial layers 108, 112 and the substrate 100 along the direction of the Z-axis, stopping at the masks 106 and 110, and proceeding instead with the complete removal, along the direction of the etching (Z-axis) of the epitaxial layers 108, 112 and the substrate 100 where not protected by the masks 106 and 110. If necessary, a further etching is carried out to remove any further materials present on the epitaxial layer 112 following the previous manufacturing steps. The support frame 2 and the movable structure 6 are thus defined (the latter, being separated from the support frame 2 along the perimeter following the previous etching step, except for the support portion 14).

With reference to FIG. 10, the masks 110 and 106 are removed by wet etching, except for a portion of the mask 106 buried in the epitaxial layer 108 at the pillar 4. The presence of this portion of mask does not entail any disadvantage in terms of operation of the MEMS structure 50.

The step of coupling the bottom support 26 onto the epitaxial layer 108 is then carried out, obtaining the MEMS structure 50 of FIG. 1. In forming some alternative embodiments of the MEMS structure 50, this step of coupling the bottom support 26 onto the epitaxial layer 108 is optional.

Figure 11:
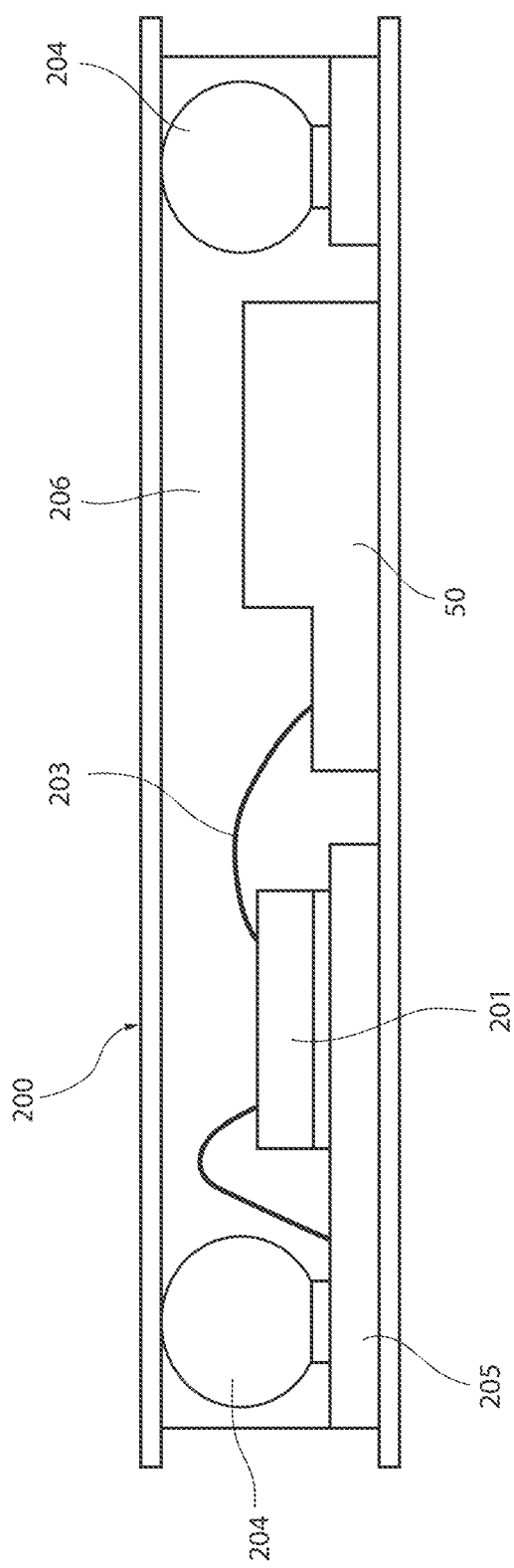
FIG. 11 schematically shows a package having the MEMS button structure of FIGS. 1 and 2 and an ASIC controller housed therein.

FIG. 11 schematically illustrates a package, or other housing, 200 having the MEMS structure 50 and a controller, or ASIC, 201 housed therein. The MEMS structure 50 is coupled, through the bottom support 26, to one side of the package 200 at which the force F acts. The ASIC 201 is coupled to the same side of the package 200 through a printed circuit board 205.

The electrical connection between the MEMS structure 50 and the ASIC 201 may be implemented, inside the package 200, through conductive wires (wire bonding) 203, and further conductive balls 204 may be present to physically and electrically couple opposite sides of the package, thus forming an electrical connection towards the top side of the package, opposite to the side having the MEMS structure 50 arranged thereat The inside of the package 200 may also be filled with a resin 206, according to the technique known as "injection molding".

Figure 12:
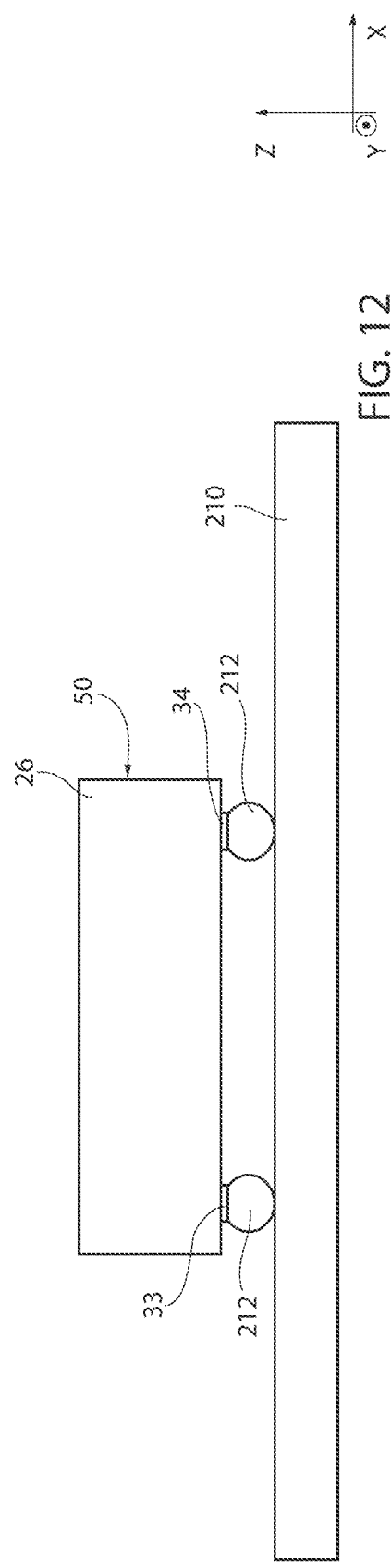
FIG. 12 schematically shows the MEMS button structure of FIGS. 1 and 2 housed on a flexible board.

Other forms of packaging may be provided, including, for example, the MEMS structure 50 being mounted on a flexible board 210, at the side of the MEMS structure 50 opposite to that having the bottom support 26, as illustrated in FIG. 12. In this manner, the electrical connections with the conductive pads 33, 34 may be formed through conductive balls 212 coupled to the flexible board and the bottom support 26 may be mechanically coupled to a body (e.g., the body 40 of FIG. 3) which, in use, receives the force F.

The disclosure and the related manufacturing process described herein have different advantages.

For example, the described MEMS structure is impermeable to water or other liquids, without therefore having to provide sealing elements (for example, O-rings) for insulating it from the external environment. Furthermore, this structure can be completely housed in a package or other housing that is not accessible from the outside, by further improving the impermeability.

The described MEMS structure has reduced overall size and therefore may also be employed in electronic devices of reduced dimensions, such as a smartwatch or a smartphone.

In addition, the force detection principle allows to have a good linearity in the response, as well as accuracy in the determination of the external force applied. Furthermore, the force detection principle used allows to have a good yield.

Furthermore, the described MEMS structure may be manufactured using common techniques or steps in the manufacturing of MEMS devices, therefore at low costs and exploiting the manufacturing tools already in place in many semiconductor processing plants.

Finally, it is clear that modifications and variations may be made to what has been described and illustrated herein, without departing from the protective scope of the present disclosure, as defined in the attached claims.

A button device (50) may be summarized as including a fixed support structure (2); a movable structure (6), laterally surrounded at a distance by said support structure (2), physically coupled to the support structure (2) through a protrusion (14), and configured to deform at least in part under the action of an external force (F); and a cap (24), coupled to the support structure (2) by a fluid-tight region (27), the fluid-tight region (27) surrounding, in a top-plan view, said movable structure (6), wherein the movable structure (6) includes: a suspended structure (8), having a first stiffness, including a first side coupled to the support structure (2) through said protrusion (14) and at least a second and a third side extending from the first side in structural continuity thereof; a piston element (4) configured to translate, under the action of an external force (F), along a direction parallel to said external force (F); at least a first and a second deformable element (10a, 12a) extending in structural continuity of the suspended structure (8) from the second and the third sides, respectively, towards the piston element (4), and having a second smaller stiffness than the first stiffness; a first anchor (16), having the second stiffness, coupled between the piston element (4) and the first deformable element (10a); a second anchor (18), having the second stiffness, coupled between the piston element (4) and the second deformable element (12a); a first sensing element (21) coupled to the first deformable element (10a), configured to sense a deformation of the first sensing element (21) and generate a signal indicative of said deformation of the first sensing element (21); and a second sensing element (23) coupled to the second deformable element (12a), configured to sense a deformation of the second sensing element (23) and generate a respective signal indicative of said deformation of the second sensing element (23).

The piston element (4), the first and the second deformable elements (10a, 12a), and the first and the second anchor elements (16, 18) may be mutually connected to each other in such a way that, when the external force (F) acts on the piston element (4), the first and the second anchor elements (16, 18) transfer said external force (F) to the first and respectively the second deformable elements (10a, 12a), so that the first and the second deformable elements (10a, 12a) may be subject to an axial deformation detectable by said first and second sensing elements (21, 23).

The first anchor (16) may include a first pair of arms, and the second anchor (18) may include a second pair of arms.

Said suspended structure (8) may have a greater thickness than the thickness of the first and the second deformable elements (10a, 12a) and of the first and the second anchor elements (16, 18).

The suspended structure (8) may be coupled to the support structure (2) exclusively by a beam extending from the first side of the support structure (2), said beam having the first stiffness.

The second and the third sides of the suspended structure (8) may be laterally facing opposite sides of the piston element (4).

The first and the second sensing elements may be piezoelectric transducers.

The button device may further include a cap (24) fluid-tight fixed to the support structure (2) and completely surrounding, in the top-plan view, the movable structure (6).

The button device may further include conductive tracks extending between the first and, respectively, the second sensing elements (23) and respective electrical contact pads.

The button device may further include a bearing element (26; 40) fixed to the support structure (2) and to the piston element (4) at the portion of the piston element (4) configured to receive said external force (F).

Said bearing element (26) may be a double-sided adhesive tape, such as for example a Die Attach Film, DAF.

Said bearing element (40) may have a first thickness at the support structure (2) and a second thickness smaller than the first thickness at the piston element (4), in such a way that it may be deformable by said external force (F) exclusively at the piston element (4).

A package (200) may be summarized as including an inner cavity and a deformable portion delimiting one side of the inner cavity and intended to receive, in use, said external force (F), wherein said inner cavity houses: a button device (50), coupled to said deformable portion; a control device, or an ASIC, (201) operatively coupled to the button device; and a filling layer (206), which completely covers said button device (50) and said control device, or an ASIC, (201).

A method of manufacturing a button device may be summarized as including the steps of: forming a fixed support structure (2); forming a movable structure (6), laterally surrounded at a distance by said support structure (2) and configured to deform at least in part under the action of an external force (F); forming a protrusion (14) from the movable structure (6) towards the support structure (2), which physically couples the movable structure (6) to the support structure (2); and coupling a cap (24) to the support structure (2), by a fluid-tight region (27), the fluid-tight region (27) surrounding, in a top-plan view, said movable structure (6), wherein the step of forming the movable structure (6) includes the steps of: forming a suspended structure (8), having a first stiffness, including a first side coupled to the support structure (2) through said protrusion (14) and at least a second and a third side extending from the first side in structural continuity thereof; forming a piston element (4) configured to translate, under the action of an external force (F), along a direction parallel to said external force (F); forming at least a first and a second deformable element (10a, 12a) extending in structural continuity of the suspended structure (8) from the second and the third sides, respectively, towards the piston element (4), and having a second stiffness smaller than the first stiffness; forming a first anchor (16), having the second stiffness, coupled between the piston element (4) and the first deformable element (10a); forming a second anchor (18), having the second stiffness, coupled between the piston element (4) and the second deformable element (12a); forming a first sensing element (21) on the first deformable element (10a), configured to sense a deformation of the first sensing element (21) and generate a signal indicative of said deformation of the first sensing element (21); and forming a second sensing element (23) on the second deformable element (12a), configured to sense a deformation of the second sensing element (23) and generate a respective signal indicative of said deformation of the second sensing element (23).

The piston element (4), the first and the second deformable elements (10a, 12a), and the first and the second anchor elements (16, 18) may be mutually connected to each other in such a way that, when the external force (F) acts on the piston element (4), the first and the second anchor elements (16, 18) transfer said external force (F) to the first and respectively the second deformable elements (10a, 12a), so that the first and the second deformable elements (10a, 12a) may be subject to an axial deformation detectable by said first and second sensing elements (21, 23).

The first anchor (16) comprises forming a first pair of arms, and forming the second anchor (18) includes forming a second pair of arms.

Said suspended structure (8) may have a greater thickness than the thickness of the first and the second deformable elements (10a, 12a) and of the first and the second anchor elements (16, 18).

The method forming the second and the third sides of the suspended structure (8) may include forming the second and the third sides of the suspended structure (8) laterally facing opposite sides of the piston element (4).

The method forming the first and the second sensing elements may include forming respective piezoelectric transducers.

The method may further include the step of fluid-tight fixing a cap (24) completely surrounding, in the top-plan view, the movable structure (6), to the support structure (2).

The method may further include the step of fixing a bearing element (26; 40) to the support structure (2) and to the piston element (4) at the portion of the piston element (4) configured to receive said external force (F), said bearing element being one of: a double-sided adhesive tape, such as for example a Die Attach Film, DAF; a support (40) may have a first thickness at the support structure (2) and a second thickness smaller than the first thickness at the piston element (4), in such a way that it may be deformable by said external force (F) exclusively at the piston element (4).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a support structure in a fixed position;
    a movable structure surrounded by the support structure and coupled to the support structure through a protrusion that extends from the support structure, the movable structure including:
        a suspended structure having a first stiffness, a first side coupled to the support structure through the protrusion, and a second and third side that extend from the first side;
        a piston element configured to, in operation, translate along a direction of an external force;
        a first and a second deformable element that extend from the second and the third sides, respectively, towards the piston element, and the first and second deformable elements have a second stiffness less than the first stiffness;
        a first anchor with the second stiffness is coupled between the piston element and the first deformable element;
        a second anchor with the second stiffness is coupled between the piston element and the second deformable element;
        a first sensing element coupled to the first deformable element and configured to, in operation, sense a deformation of the first deformable element and generate a first signal indicative of the deformation of the first deformable element; and
        a second sensing element coupled to the second deformable element and configured to, in operation, sense a deformation of the second deformable element and generate a second signal indicative of the deformation of the second sensing element; and
    a cap coupled to the support structure by a fluid-tight seal, the fluid-tight seal extends around the movable structure.

2. The device according to claim 1, wherein the piston element, the first and the second deformable elements, and the first and the second anchor elements are in mechanical cooperation with each other, and the first and second anchor elements are configured to, in operation, when the external force acts on the piston element, transfer the external force to the first and the second deformable elements to deform the first and the second deformable elements.

3. The device according to claim 1, wherein said suspended structure has a first thickness greater than respective thicknesses of the first and the second deformable elements and of the first and the second anchor elements.

4. The device according to claim 1, wherein the protrusion has the first stiffness.

5. The device according to claim 1, wherein the second and the third sides, respectively, of the suspended structure are facing opposite sides, respectively, of the piston element, and the piston element is between the second side and the third side.

6. The device according to claim 1, further comprising a support coupled to the support structure, and wherein the piston element and the movable structure are within a cavity delimited by the support structure, the cap, and the support.

7. The device according to claim 1, further comprising conductive tracks extending along the first, second, and third sides, respectively, of the suspended structure, and coupled between the first and the second sensing elements, respectively, to respective electrical contact pads on the support structure.

8. The device according to claim 1, further comprising a support element coupled to the support structure and to the piston element.

9. The device according to claim 8, wherein the support element includes a double-sided adhesive tape.

10. The device according to claim 8, wherein the support element has a first portion with a first thickness overlapped by the support structure and a second portion with a second thickness overlapped by the piston element, and the second thickness is smaller than the first thickness at the piston element.

11. A method, comprising:
    forming a support structure;
    forming a movable structure surrounded by the support structure;
    forming a protrusion extending from the movable structure towards the support structure that couples the movable structure to the support structure; and
    coupling a cap to the support structure by a fluid-tight seal, the fluid-tight seal extending around the movable structure,
    wherein forming the movable structure includes:
        forming a suspended structure having a first stiffness, a first side coupled to the support structure through the protrusion, and a second and a third side extending from the first side;
        forming a piston element configured to, in operation translate along a direction of an external force;
        forming at least a first and a second deformable element extending from the second and the third sides, respectively, towards the piston element, and the first and second deformable elements having a second stiffness less than the first stiffness;
        forming a first anchor having the second stiffness and coupled between the piston element and the first deformable element;
        forming a second anchor having the second stiffness and coupled between the piston element and the second deformable element;
        forming a first sensing element on the first deformable element, configured to, in operation, sense a deformation of the first sensing element and generate a first signal indicative of the deformation of the first deformable element; and
        forming a second sensing element on the second deformable element, configured to, in operation, sense a deformation of the second deformable element and generate a second signal indicative of the deformation of the second deformable element.

12. The method according to claim 11, wherein forming the piston element, forming the first and the second deformable elements, and forming the first and the second anchor elements includes forming the piston element, the first and second deformable elements, and the first and second anchor elements in mechanical cooperation with each other to sense, in operation, deformations of the first and second deformable elements.

13. The method according to claim 12, wherein forming the first anchor comprises forming a first pair of arms, and forming the second anchor comprises forming a second pair of arms.

14. The method according to claim 12, wherein forming the suspended structure includes forming the suspended structure with a first thickness, and forming the first and the second deformable elements and forming the first and the second anchor elements includes forming the first and second deformable elements and forming the first and second anchor elements with respective thicknesses less than the first thickness of the suspended structure.

15. The method according to claim 11, wherein forming the second and the third sides of the suspended structure comprises forming the second and the third sides of the suspended structure to face opposite sides of the piston element.

16. The method according to claim 11, further comprising forming a cavity in which the piston element and the movable structure are present by coupling a support to the support structure to delimit the cavity with the support structure, the cap, and the support.

17. The method according to claim 11, further comprising coupling a support element to the support structure and to the piston element, coupling the support element to the support structure including:
   coupling a double-sided adhesive tape to the support structure and the piston element; and
   coupling a body to the double-sided adhesive tape overlapping the suspended structure with a first portion of the body having a first thickness and overlapping the piston element with a second portion of the body having a second thickness less than the first thickness.

18. A device, comprising:
a microelectromechanical button structure including:
   a support;
   a cap coupled to the support with a fluid tight seal;
   a cavity between the cap and the support;
   a piston element within the cavity;
   a movable structure within the cavity, the movable structure including:
      a ring portion around the piston element, the ring portion having a first thickness;
      a first deformable portion extending from the ring portion towards the piston element, the first deformable portion coupled to the piston element, and the first deformable portion having a second thickness less than the first thickness; and
      a second deformable portion extending from the ring portion towards the piston element and coupled to the piston element;
   a first sensing element on the first deformable portion; and
   a second sensing element on the second deformable portion.

19. The device of claim 18, further comprising:
a first support arm that extends from the first deformable portion to the piston element and couples the first deformable portion to the piston element; and
a second support arm that extends from the second deformable portion to the piston element and couples the second deformable portion to the piston element.

20. The device of claim 18, further comprising:
a first electrical contact pad outside of the cavity and on the support structure;
a second electrical contact pad outside of the cavity and on the support structure;
a first conductive track coupled to the first sensing element and coupled to the first electrical contact, the first conductive track extending from the first sensing element to the first electrical contact pad to couple the first sensing element to the first electrical contact pad, and the first conductive track being at least partially overlapped by the cap; and
a second conductive track coupled to the second sensing element and coupled to the second electrical contact, the second conductive track extending from the second sensing element to the second electrical contact pad to couple the second sensing element to the second electrical contact pad, and the second conductive track being at least partially overlapped by the cap.

* * * * *